US008643991B2

(12) United States Patent
Hong (10) Patent No.: US 8,643,991 B2
(45) Date of Patent: Feb. 4, 2014

(54) SYSTEM FOR MONITORING OVER VOLTAGE PROTECTION OF BATTERY PACK AND METHOD THEREOF

(75) Inventor: Seongpyo Hong, Yongin-si (KR)

(73) Assignee: Samsung SDI Co., Ltd., Giheung-gu, Yongin-si, Gyeonggi-do (KR)

( * ) Notice: Subject to any disclaimer, the term of this patent is extended or adjusted under 35 U.S.C. 154(b) by 193 days.

(21) Appl. No.: 13/323,209

(22) Filed: Dec. 12, 2011

(65) Prior Publication Data

US 2012/0154967 A1 Jun. 21, 2012

(30) Foreign Application Priority Data

Dec. 15, 2010 (KR) .................. 10-2010-0128207

(51) Int. Cl.
 *H02H 3/22* (2006.01)
(52) U.S. Cl.
 USPC ........................... 361/91.1; 361/111
(58) Field of Classification Search
 USPC ................... 361/91.1, 111; 320/162
 See application file for complete search history.

(56) References Cited

U.S. PATENT DOCUMENTS

| 6,888,468 | B2 | 5/2005 | Bertness et al. |
| 7,642,787 | B2 | 1/2010 | Bertness et al. |
| 8,282,258 | B2 * | 10/2012 | Ye et al. ............ 362/607 |
| 2005/0007074 | A1 | 1/2005 | Koster et al. |
| 2008/0186028 | A1 | 8/2008 | Jones et al. |
| 2009/0009143 | A1 * | 1/2009 | Odaohhara .............. 320/162 |
| 2009/0128094 | A1 | 5/2009 | Okuto |

FOREIGN PATENT DOCUMENTS

| JP | 2005-327604 A | 11/2005 |
| JP | 2007-285972 A | 11/2007 |
| KR | 200181499 | 5/2000 |
| KR | 2003-0008501 A | 1/2003 |
| KR | 1020060026147 A | 3/2006 |
| KR | 1020080082869 A | 9/2008 |
| KR | 2008-0092151 A | 10/2008 |

OTHER PUBLICATIONS

Korean Notice of Allowance issued by Korean Patent Office on Apr. 13, 2012 in connection with Korean Application No. 10-2010-0128207 and Request for Entry of the Accompanying Office Action. Korean Office Action issued by Korean Patent Office on Nov. 21, 2011 in the corresponding Korean application No. 2010-0128207.

* cited by examiner

*Primary Examiner* — Danny Nguyen
(74) *Attorney, Agent, or Firm* — Robert E. Bushnell, Esq.

(57) ABSTRACT

An over voltage protection (OVP) monitoring system and a method thereof. The OVP monitoring system includes a battery pack connected to an external system, the battery pack including a battery, a first memory to store a voltage value of the battery, a second memory comprising a first sub-memory and a second sub-memory to store numbers of OVP operations of the battery, a controller to store the voltage value of the battery in the first memory upon an occurrence of an OVP operation and to increment a number of OVP operations stored in either the first sub-memory or the second sub-memory according to the voltage value of the battery stored in the first memory and a signal generator to generate either a first alarm signal or a second alarm signal based on the contents of the first and second sub-memories.

17 Claims, 5 Drawing Sheets

SYSTEM FOR MONITORING OVER VOLTAGE PROTECTION OF BATTERY PACK AND METHOD THEREOF

CLAIM OF PRIORITY

This application makes reference to, incorporates the same herein, and claims all benefits accruing under 35 U.S.C. §119 from an application for *SYSTEM FOR MONITORING OVER VOLTAGE PROTECTION OF BATTERY PACK AND METHOD THEREOF* earlier filed in the Korean Intellectual Priority Office on 15 Dec. 2010 and there duly assigned Serial No. 10-2010-0128207.

BACKGROUND OF THE INVENTION

1. Field of the Invention

The present invention relates to a system for monitoring over voltage protection of a battery pack and a method thereof.

2. Description of the Related Art

With the development of portable electronic devices such as cellular phones, notebook computers, camcorders, PDAs (personal digital assistants), or the like, rechargeable batteries are intensively being researched.

The rechargeable battery is fabricated in the form of a battery pack including a battery cell and a charging/discharging circuit. A charging or discharging operation of the battery cell is performed using an external power supply or an external load via an external terminal arranged within the battery pack. That is to say, when the external power supply is connected to the battery pack through the external terminal, the battery cell is charged by the external power supply supplied through the external terminal and the charging/discharging circuit. When the external load is connected to the battery pack through the external terminal, the battery cell is discharged by the power supplied to the external load through the charging/discharging circuit and the external terminal.

In a case where the battery is charged with a high voltage due to the external power supply during the charging/discharging operation of the battery pack or cell, imbalance occurs due to a problem with the battery and an OVP (over voltage protection) operation may be generated in the battery pack. In such a case, if the OVP operation frequently occurs, it is quite difficult to determine whether the external load or the external power supply has caused the occurrence of the OVP operation.

SUMMARY OF THE INVENTION

One embodiment of the present invention is to provide a system of monitoring over voltage protection (OVP) of a battery pack, which can inform whether there is any problem in an event of the OVP operation, and an OVP monitoring method using the same.

According to one aspect of the present invention, there is provided an over voltage protection (OVP) monitoring system, including a battery pack connected to an external system, the battery pack including a battery, a first memory to store a voltage value of the battery, a second memory comprising a first sub-memory and a second sub-memory to store numbers of OVP operations of the battery, a controller to store the voltage value of the battery in the first memory upon an occurrence of an OVP operation and to increment a number of OVP operations stored in either the first sub-memory or the second sub-memory according to the voltage value of the battery stored in the first memory and a signal generator to generate either a first alarm signal indicating a need to check the external system or a second alarm signal indicating a need to check the battery pack according to numbers of OVP operations stored in at least one of the first sub-memory and the second sub-memory of the second memory.

The OVP monitoring system may also include a sensor to detect the occurrence of the OVP operation in the battery and to notify the controller of the occurrence of the OVP operation. The controller to store the voltage value of the battery at a most recent OVP operation upon an occurrence of a plurality of OVP operations. The controller to compare the voltage value of the battery stored in the first memory with a preset reference voltage value, the number of OVP operations stored in the first sub-memory may be incremented or the number of OVP operations stored in the second sub-memory may be incremented based on a result of said comparison.

The signal generator to compare a total number of OVP operations stored in the second memory with a preset total reference number of OVP operations, and when the total number of OVP operations stored in the second memory is greater than the preset total reference number of OVP operations, the signal controller to compare a number of OVP operations stored in the first sub-memory with a preset first reference number of OVP operations, and output either the first alarm signal or the second alarm signal based on whether the number of OVP operations stored in the first sub-memory is greater than the preset first reference number of OVP operations. The first sub-memory and the second sub-memory may be memories divided into an upper area and a lower area in a single storage area having a same address.

Alternatively, the signal generator may compare the number of OVP operations stored in the first sub-memory with a preset first reference number of OVP operations, and generate the first alarm signal when the number of OVP operations stored in the first sub-memory is greater than the preset first reference number of OVP operations, and compare the number of OVP operations stored in the second sub-memory with a preset second reference number of OVP operations, and generate the second alarm signal when the number of OVP operations stored in the second sub-memory is greater than the preset second reference number of OVP operations. The first sub-memory and the second sub-memory may be different memories having different addresses. The signal generator to output either the first alarm signal or the second alarm signal to the external system, the external system to display the received alarm information.

According to another aspect of the present invention, there is provided a method of monitoring over voltage protection (OVP) of a battery pack, including storing in a first memory a battery voltage value measured upon an occurrence of an OVP (Over Voltage Protection) operation in a battery of the battery pack, incrementing either a number of OVP operations stored in a first sub-memory of a second memory or a number of OVP operations stored in a second sub-memory of a second memory according to the battery voltage value stored in the first memory and generating either a first alarm signal indicating a need to check an external system connected to the battery pack or a second alarm signal indicating a need to check the battery pack according to a number of OVP operations stored in at least one of the first sub-memory and the second sub-memory of the second memory.

The method can also include detecting the occurrence of an OVP operation of the battery prior to the storing step. The storing step may include storing the battery voltage value measured for a most recent occurrence of an OVP operation upon an occurrence of a plurality of OVP operations. The incrementing step may include determining whether the battery voltage value stored in the first memory is greater than a preset reference voltage value and incrementing either the number of OVP operations stored in the first sub-memory or the number of OVP operations stored in the second sub-memory based on said determination.

The signal generating step may include determining whether a total number of OVP operations stored in the first sub-memory and the second sub-memory of the second memory is greater than a preset total reference number of OVP operations, comparing the number of OVP operations stored in the first sub-memory of the second memory with a preset first reference number of OVP operations upon the total number of OVP operations stored in the first sub-memory and second sub-memory of the second memory being greater than the preset total reference number of OVP operations and outputting one of a first alarm signal and a second alarm signal based on whether the number of OVP operations stored in the first sub-memory of the second memory is greater than the preset first reference number of OVP operations. The first sub-memory and the second sub-memory of the second memory may be storage areas divided into an upper area and a lower area in a single memory having a single address.

Alternatively, the signal generating step may include comparing the number of OVP operations stored in the first sub-memory of the second memory with a preset first reference number of OVP operations, generating the first alarm signal when the number of OVP operations stored in the first sub-memory is greater than the preset first reference number of OVP operations, comparing the number of OVP operations stored in the second sub-memory of the second memory with a preset second reference number of OVP operations, generating the second alarm signal when the number of OVP operations stored in the second sub-memory of the second memory is greater than the preset second reference number of OVP operations. The first sub-memory and the second sub-memory of the second memory may be different storage areas having different addresses.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, embodiments of the present invention will be described in detail with reference to the accompanying drawings such that they can easily be made and used by those skilled in the art.

An OVP monitoring system of a battery pack 10 according to an embodiment of the present invention will now be described. First, the overall structure of a battery pack 10 according to an embodiment of the present invention will be described.

Figure 1:
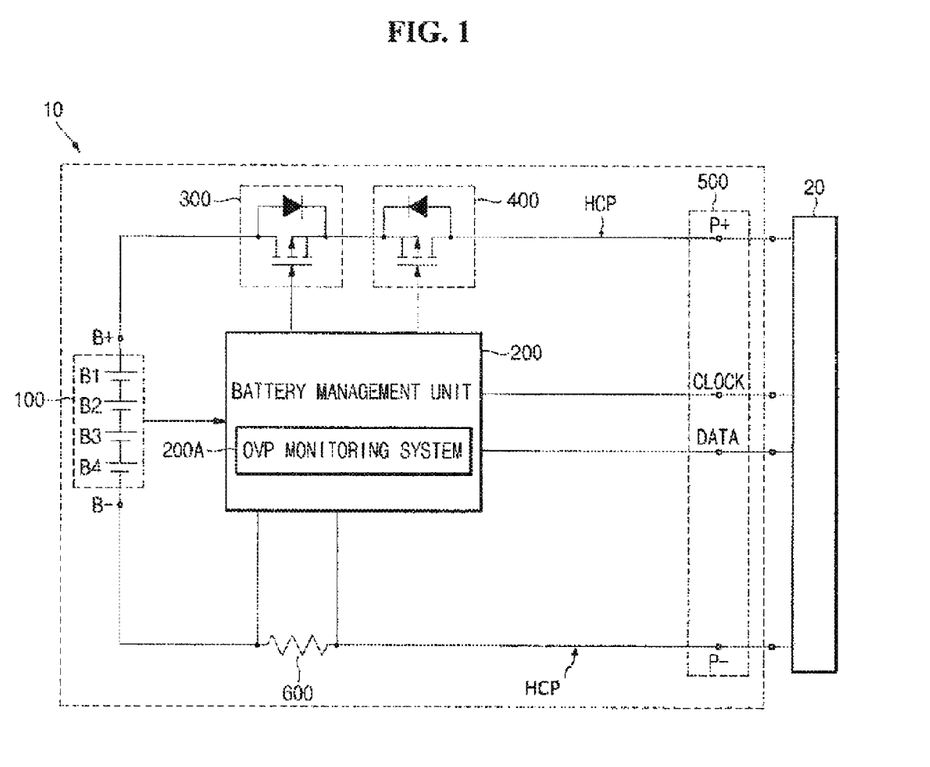
FIG. 1 is a circuit diagram illustrating the overall structure of a battery pack according to an embodiment of the present invention.

Turning now to FIG. 1, FIG. 1 is a circuit diagram illustrating the overall structure of a battery pack 10 according to an embodiment of the present invention. Referring now to FIG. 1, the battery pack 10 according to the illustrated embodiment may include a battery 100, a battery management unit 200, a charging device 300, a discharging device 400, a connector 500, and a sensor resistor 600.

FIG. 1 shows battery back 10 being connected to an external system 20 via connector 500. The external system 20 may be an external load such as a cellular phone or a portable notebook computer, or a charger for charging battery 100.

The battery pack 10 may be connected to the external system 20, specifically the charger, through the connector 500 to perform a charging operation of the battery 100. In addition, the battery pack 10 may be connected to an external system 20, specifically an external load, such as a notebook computer through the connector 500 to perform a discharging operation of the battery 100, allowing the battery 100 to power the external load 20. A high current path (HCP) between the battery 100 and the connector 500 is used as a charging/discharging path, and a relatively large amount of current may flow through the high current path (HCP). A power terminal of the charger or the external load 20 may be connected to a first pack terminal (P+) and a second pack terminal (P−) of the connector 500, and communication terminals of the charger 20 may be connected to communication terminals (CLOCK, DATA) of the connector 500.

The battery 100 may include one or more battery cells B1, B2, B3 and B4, and may be charged or discharged with a constant voltage. In FIG. 1, reference symbols B+ and B− represent electrode terminals, respectively, which are a positive electrode terminal B+ and a negative electrode terminal B− of the battery cells B1, B2, B3 and B4 connected in series to each other. The number of battery cells in battery 100 may vary according to the capacitance required by the external load 20.

The battery management unit 200 detects a voltage of the battery 100 and controls operations of the charging device 300 and the discharging device 400, thereby controlling charging and discharging of the battery 100. For example, when the battery pack 10 and the charger 20 are connected to each other through the connector 500, the battery management unit 200 sets the charging device 300 to an ON state and the discharging device 400 to an OFF state, thereby allowing the battery 100 to be charged. In addition, when the battery pack 10 and the external load 20 are connected to each other through the connector 500, the battery management unit 200 sets the charging device 300 to an OFF state and the discharging device 400 to an ON state, thereby allowing the battery 100 to power the external load 20 (i.e. to be discharged). Although not shown, the battery management unit 200 may detect all of the voltages of the respective battery cells B1, B2, B3 and B4.

An OVP monitoring system 200A may be configured within the battery management unit 200. The OVP monitoring system 200A will later be described in detail in conjunction with FIG. 2.

The charging device 300 and the discharging device 400 are connected to the HCP between the battery 100 and the connector 500 and may perform charging or discharging of the battery 100. The charging device 300 may include a field effect transistor (FET1) and a parasitic diode (D1). The discharging device 400 may include a field effect transistor (FET2) and a parasitic diode (D2). A source and a drain of the FET1 may be connected in an opposite direction to the source and the drain of the FET2. With this construction, the FET1 may limit the flow of current from the connector 500 to the battery 100. The FET2 may be connected so as to limit the flow of current from the battery 100 to the connector 500. The D1 and D2 may be configured to allow current to flow in a direction opposite to the direction in which the flow of current is limited.

The connector 500 is connected to the battery 100 and is also connected to the charger 20 during charging, so that it may operate as a terminal for charging the battery 100. Alternatively, the connector 500 is connected to the external load 20 during discharging, so that it may operate as a terminal for discharging the battery 100. To this end, the connector 500 may include a first pack terminal P+ and a second pack terminal P−. The first pack terminal P+ may be a positive electrode pack terminal connected to the positive electrode terminal B+ of the battery 100. The second pack terminal P− may be a negative electrode pack terminal connected to the negative electrode terminal B− of the battery 100. When the charger 20 is connected to the connector 500, charging from the charger 20 to the battery 100 may be performed. When the external load 20 is connected to the connector 500, discharging from the battery 100 to the external load 20 may be performed.

In addition, the connector 500 may include communication terminals (CLOCK, DATA) connected to the battery management unit 200. The communication terminals (CLOCK, DATA) may include a clock terminal CLOCK and a data terminal DATA. If the charger 20 is connected to the connector 500, the communication terminal allows for communication between the battery management unit 200 and the charger 20. For example, the communication terminals (CLOCK, DATA) may transfer voltage information from the battery management unit 200 to the charger 20 or charging control information to the charger 20. In addition, the alarm signal, or the like output from the OVP monitoring system 200A is transferred to the external load 20 via the communication terminals (CLOCK, DATA).

The sensor resistor 600 may be arranged on the HCP between the battery 100 and the connector 500. In detail, the sensor resistor 600 may be connected between the negative electrode terminal B− of the battery 100 and the second pack terminal P−. In addition, opposite ends of the sensor resistor 600 may be connected to the battery management unit 200 so that the battery management unit 200 can sense a voltage across sensor resistor 600 and determine a current passing through sensor resistor 600. In such a manner, the sensor resistor 600 transfers information on the charge or discharge current of the battery 100 to the battery management unit 200.

The battery management unit 200 of battery pack 10 includes an over voltage protection (OVP) monitoring system 200A. The OVP monitoring system 200A of battery management unit 200 of the battery pack 10 of FIG. 1 according to an embodiment of the present invention will now be described in conjunction with FIG. 2.

Figure 2:
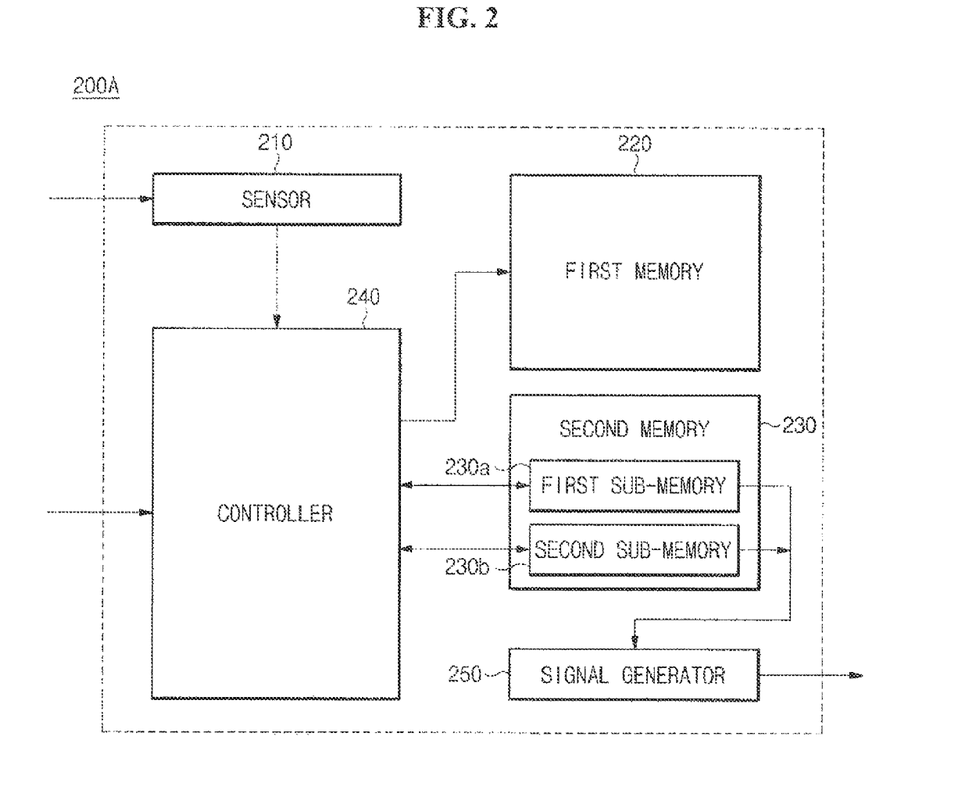
FIG. 2 is a block diagram of an OVP monitoring system of the battery pack of FIG. 1 according to an embodiment of the present invention.

Turning now to FIG. 2, FIG. 2 is a block diagram of an over voltage protection (OVP) monitoring system 200A of the battery pack 10 of FIG. 1 according to an embodiment of the present invention. Referring to FIG. 2, the OVP monitoring system 200A according to the illustrated embodiment of the present invention includes a sensor 210, a first memory 220, a second memory 230, a controller 240 and a signal generator 250.

The sensor 210 detects the occurrence of an OVP operation of the battery 100 and notifies the controller 40 of the detection result. The battery management unit 200 monitors a voltage of the battery 100 to perform the OVP operation based on either an over charge or an over discharge condition, and notifies the sensor 210 of the monitoring result.

The first memory 220 may store within voltage values (VC) of the battery 100. Here, the battery voltage values (VC) may be voltage values measured by the battery management unit 200 to control charging and discharging of the battery 100.

The second memory 230 may include a first sub-memory 230a and a second sub-memory 230b. The first sub-memory 230a and the second sub-memory 230b may store the number of OVP operations of the battery 100. Here, the first sub-memory 230a and the second sub-memory 230b may be a single memory divided by upper bytes and lower bytes. Here, the first sub-memory 230a may be an area having upper bytes of the second memory 230, and the second sub-memory 230b may be an area having lower bytes of the second memory 230. Alternatively, the first sub-memory 230a and the second sub-memory 230b may be different memories having different addresses.

The controller 240 may control the first memory 220 to store the battery voltage value (VC) when an OVP operation occurs. Here, the controller 240 may store the battery voltage value (VC) measured when the last OVP operation occurs in a case where when the OVP operation occurs frequently. In addition, the controller 240 may increment the number of OVP operations stored in the first sub-memory 230a or the second sub-memory 230b according to the battery voltage value (VC) stored in the first memory 220.

The configuration of the controller 240 will now be described in more detail.

The controller 240 may compare battery voltage values (VC) stored in the first memory 220 with a preset reference voltage value (Vref). As the result, when the battery voltage value (VC) stored in the first memory 220 is greater than the preset reference voltage value (Vref), the controller 240 may increment the number of OVP operations (Novp_1) stored in the first sub-memory 230a, which may be applied to a case when there is a problem with the external system 20, for example, when the external system 20 performs charging of the battery 100 with an excessively high voltage.

Conversely, when the battery voltage value (VC) stored in the first memory 220 is not greater than the preset reference voltage value (Vref), the controller 240 may increment the number of OVP operations stored in the second sub-memory 230b (Novp_2), which may be applied to a case when there is a problem with the battery 100, for example, when a cell imbalance occurs in battery 100.

The signal generator 250 may generate a first alarm signal indicating a need to check the external system 20 or a second alarm signal indicating a need to check the battery pack 10 according to the number of OVP operations (Novp_1 and Novp_2) stored in first and second sub-memories 230a and 230b of second memory 230. In addition, the signal generator 250 may output the first alarm signal or the second alarm signal to the external system 20 through the communication terminals (CLOCK, DATA) of the connector 500.

The signal generator 250 will now be described in more detail. The signal generator 250 according to the illustrated embodiment of the present invention is of two types. The signal generator 250 of first type will now be described.

The signal generator 250 may receive information on a total number of OVP operations (Novp_total) stored in the second memory 230 on a regular basis, where Novp_total=Novp_1+Nopv_2. In addition, the signal generator 250 may compare the total number of OVP operations (Novp_total) with a preset total reference number of OVP operations (Novp_total_ref). As a result, when the total number of OVP operations (Novp_total) is greater than the preset total reference number of OVP operations (Novp_total_ref), the signal generator 250 may then proceed to compare the number of OVP operations stored in the first sub-memory 230a (Novp_1) with a preset first reference number of OVP operations (Novp_1_ref). When the number of OVP operations (Novp_1) stored in the first sub-memory 230a is greater than the preset first reference number of OVP operations (Novp_1_ref), the signal generator 250 may generate the first alarm signal. Conversely, when the number of OVP operations stored in the first sub-memory 230a (Novp_1) is not greater than the preset first reference number of OVP operations (Novp_1_ref), the signal generator 250 may generate the second alarm signal.

Meanwhile, when the total number of OVP operations (Novp_total) is greater than the preset total reference number of OVP operations (Novp_total_ref), the signal generator 250 may alternatively proceed to compare the number of OVP operations stored in the second sub-memory 230b (Novp_2) with a preset second reference number of OVP operations (Novp_2_ref). When the number of OVP operations stored in the second sub-memory 230b (Novp_2) is greater than the preset second reference number of OVP operations (Novp_2_ref), the signal generator 250 may generate the second alarm signal. Conversely, when the number of OVP operations stored in the second sub-memory 230b (Novp_2) is not greater than the preset second reference number of OVP operations (Novp_2_ref), the signal generator 250 may generate the first alarm signal. Because Novp_total_ref=Novp_1_ref+Novp_2_ref, and because Novp_total=Novp_1+Novp_2, it is not necessary to compare both of Novp_1 and Novp_2 with Novp_1_ref and Novp_2_ref respectively as each of these two comparisons will lead to the same result.

The first type of signal generator 250 is in communication with the first sub-memory 230a and the second sub-memory 230b divided in one single memory 230 and having one address, and may output the first alarm signal or the second alarm signal by determining whether the number of OVP operations stored in the first sub-memory 230a (Novp_1) having upper bytes is greater than the preset first reference number of OVP operations (Novp_1_ref).

The signal generator 250 of second type will now be described.

The signal generator 250 may receive information on numbers of OVP operations stored in the first sub-memory 230a (Novp_1) and the second sub-memory 230b (Novp_2) on a regular basis, where Novp_total=Novp_1+Nopv_2. In addition, the signal generator 250 may compare the number of OVP operations stored in the first sub-memory 230a (Novp_1) with a preset first reference number of OVP operations (Novp_1_ref). As the result, when the number of OVP operations stored in the first sub-memory 230a (Novp_1) is greater than the preset first reference number of OVP operations (Novp_1_ref), the signal generator 250 may generate the first alarm signal. In addition, the signal generator 250 may compare the number of OVP operations stored in the second sub-memory 230b (Novp_2) with a preset second reference number of OVP operations (Novp_2_ref). When the number of OVP operations stored in the second sub-memory 230b (Novp_2) is greater than the preset second reference number of OVP operations (Novp_2_ref), the signal generator 250 may generate the second alarm signal.

The second type of signal generator 250 is in communication with the first sub-memory 230a and the second sub-memory 230b which are divided into different memories, and may output the first alarm signal or the second alarm signal based on the result of determining whether the number of OVP operations stored in each of the first sub-memory 230a and the second sub-memory 230b is greater than corresponding preset reference numbers of OVP operations.

The signal generator 250 may output the first alarm signal or the second alarm signal to the external system 20 through the communication terminals (CLOCK, DATA) of the connector 500. In addition, the external system 20 displays information regarding the first alarm signal or the second alarm signal to allow a user to recognize the information. For example, the external system 20 receives the first or second alarm signal from the OVP monitoring system 200A and displays the information regarding the corresponding alarm signal through a display or communicates the same via other means, such as by sound or by vibration.

Figure 3:
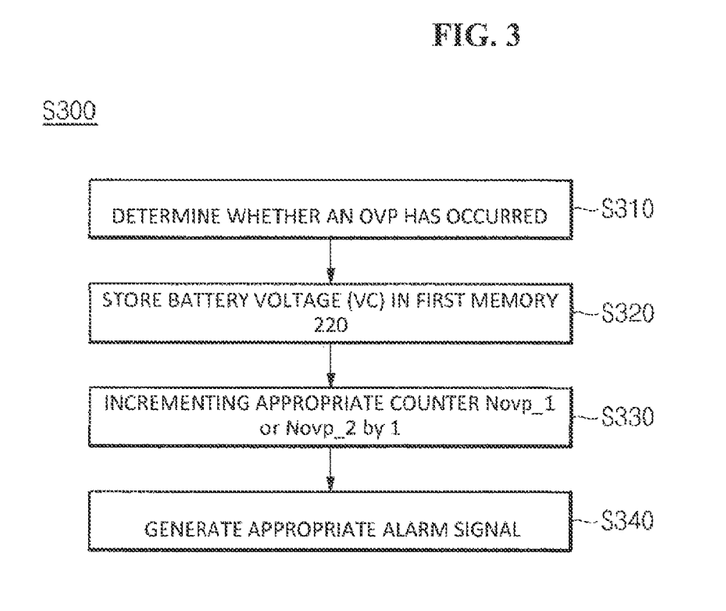
FIG. 3 is a flowchart illustrating an OVP monitoring method according to an embodiment of the present invention.

Turning now to FIG. 3, FIG. 3 is a flowchart illustrating an OVP monitoring method S300 according to an embodiment of the present invention. Referring to FIG. 3, the OVP monitoring method S300 includes determining whether an OVP has occurred step (S310), store battery value VC into first memory 220 step (S320), an incrementing step (S330) and a generate appropriate alarm signal step (S340).

In the determining whether an OVP has occurred step (S310), it is detected whether or not an OVP operation of a battery has occurred or not.

In the store battery value VC into first memory 220 step (S320), a battery voltage value (VC) measured when the OVP operation occurs in the battery 100 is stored in first memory 220. When the OVP operation occurs multiple times, the battery voltage value (VC) measured upon the most recent OVP operation is stored.

In the incrementing step (S330), either the number of OVP operations (Novp_1) stored in first sub-memory 230a of second memory 230 or the number of OVP operations (Novp_2) stored in second sub-memory 230b of second memory 230 is incremented according to the battery voltage value (VC) stored in first memory 220.

Here, the first sub-memory 230a and the second sub-memory 230b of second memory 230 may be a single memory divided by upper bytes and lower bytes. For example, first sub-memory 230a of second memory 230 may be an area of second memory 230 having upper bytes, and second sub-memory 230b of second memory 230 may be an area of second memory 230 having lower bytes. Alternatively, first sub-memory 230a and second sub-memory 230b of second memory 230 may be different memories having different addresses.

Figure 4:
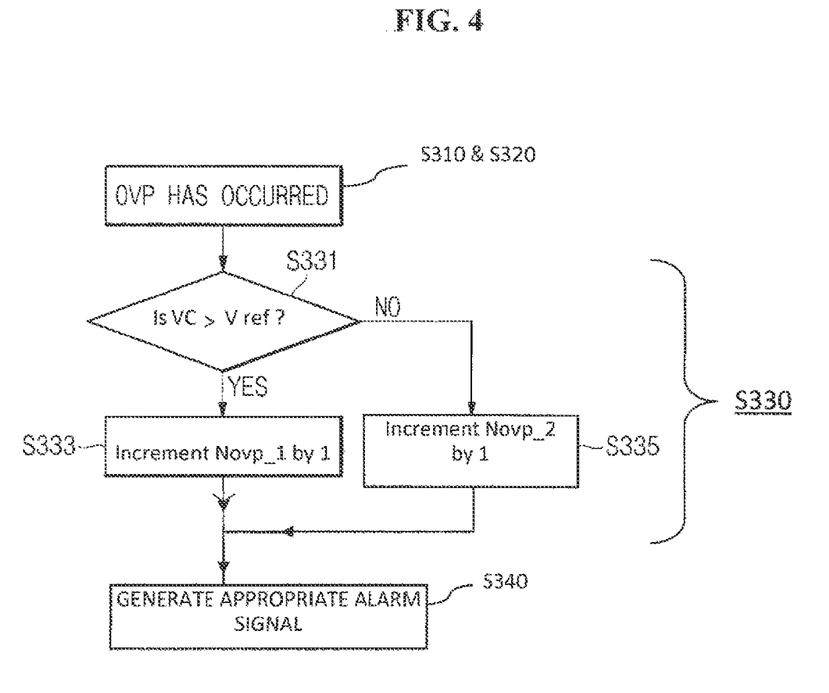
FIG. 4 is a flowchart illustrating a count-up step shown in FIG. 3.

Turning now to FIG. 4, FIG. 4 is a flowchart illustrating in detail the incrementing step S330 shown in FIG. 3. In the incrementing step (S330), when the OVP operation has occurred, the battery voltage value (VC) stored in the first memory 220 may be compared with a preset reference voltage value (Vref) (S331). When the battery voltage value (VC) stored in the first memory 220 is greater than the preset reference voltage value (Vref), the number of OVP operations (Novp_1) stored in the first sub-memory 230a of second memory 230 is incremented by 1 (S333). By incrementing Novp_1, it is determined that there is a problem with the external system 20, such as the external system 20 is charging the battery 100 with an excessively high voltage. Conversely, when the battery voltage value (VC) stored in the first memory 220 is not greater than the preset reference voltage value (Vref), the number of OVP operations (Novp_2) stored in the second sub-memory 230b of second memory 230 is incremented by (S335). By incrementing Novp_2 by 1, it is determined that there is a problem with the battery pack 10, such as a cell imbalance within battery 100.

In the signal generating step (S340), either a first alarm signal for indicating a problem with external system 20 or a second alarm signal indicating a problem with battery pack 10 may be generated according to the number of OVP operations stored in the first sub-memory 230a and in the second sub-memory 230b of second memory 230. The signal generating step (S340) according to the illustrated embodiment of the present invention may be performed in two types.

Figure 5A:
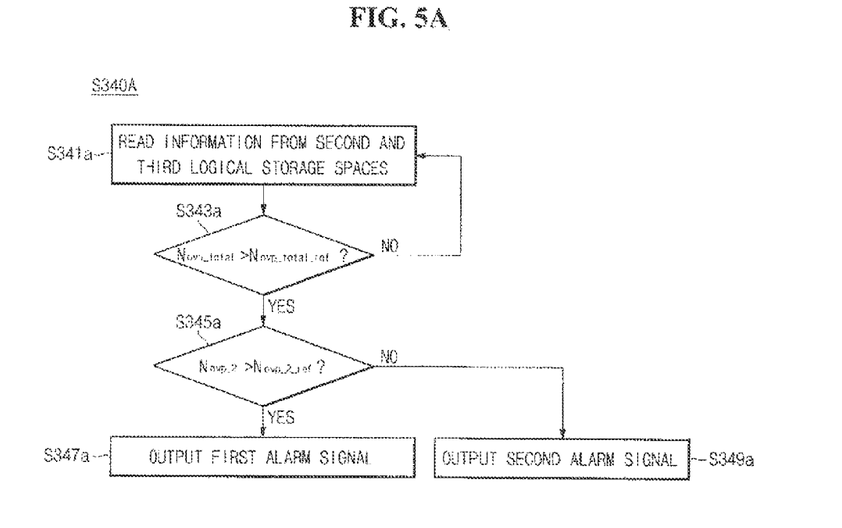
FIG. 5 is a flowchart illustrating a first example of a signal generating step shown in FIG. 3.
Figure 5B:
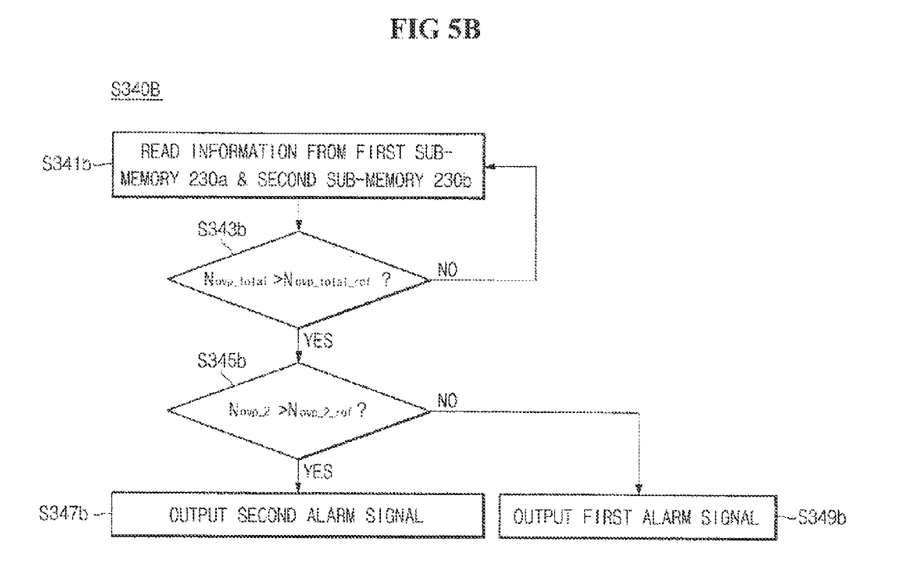
Figure 6:
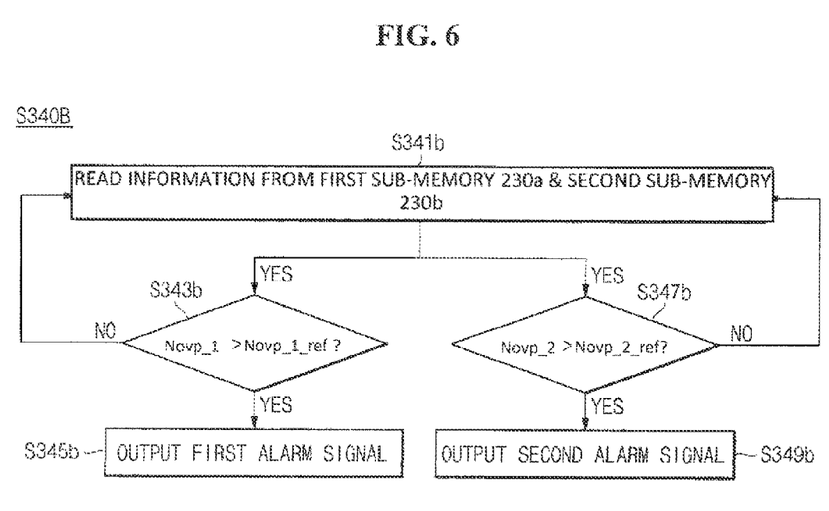
FIG. 6 is a flowchart illustrating a second example of a signal generating step shown in FIG. 3.

Turning now to FIGS. 5 and 6, FIG. 5 is a flowchart illustrating a first type of a signal generating step shown in FIG. 3, and FIG. 6 is a flowchart illustrating a second type of a signal generating step shown in FIG. 3.

The signal generating flowchart (S340A) of first type will now be described with reference to FIG. 5. First, information stored in the first sub-memory 230a and in the second sub-memory 230b of second memory 230 are read (S341a). The read information may include information on the total number of OVP operations (Novp_total=Novp_1+Novp_2) stored in the first sub-memory 230a and the second sub-memory 230b of second memory 230.

Next, the total number of OVP operations (Novp_total) is compared with a preset total reference number of OVP operations (Novp_total_ref=Novp_1_ref+Novp_2_ref) (S343a). When the total number of OVP operations (Novp_total) is greater than the preset total reference number of OVP operations (Novp_total_ref), the number of OVP operations stored in the first sub-memory 230a (Novp_1) is compared with the first reference number of OVP operations (Novp_1_ref) in step S345a. When the number of OVP operations stored in the first sub-memory 230a (Novp_1) is greater than the first reference number of OVP operations (Novp_1_ref), the first alarm signal may be output (S347a). Conversely, when the number of OVP operations stored first sub-memory 230a (Novp_1) is not greater than is greater than the first reference number of OVP operations (Novp_1_ref), the second alarm signal may be output (S349a).

Alternatively, in the first type of signal generating step, when the total number of OVP operations (Novp_total) is greater than the total reference number of OVP operations (Novp_total_ref), the number of OVP operations stored in second sub-memory 230b (Novp_2) may instead be compared with the number of OVP operations (Novp_2_ref). When the number of OVP operations (Novp_2) stored in the second sub-memory 230b is greater than the second reference number of OVP operations (Novp_2_ref), the second alarm signal may be output. Conversely, when the number of OVP operations (Novp_2) stored in the second sub-memory 230b is not greater than is greater than the second reference number of OVP operations (Novp_2_ref), the first alarm signal may be output. Either comparison should lead to the same result regarding which of the first and second alarm signal to output.

In the signal generating flowchart (S340A) of first type, the first sub-memory 230a and the second sub-memory 230b of second memory 230 are a single memory having one address, and it is determined whether or not the number of operations (Novp_1) stored in the first sub-memory 230a and having upper bytes is greater than the preset first reference number of OVP operations (Novp_1_ref), and one of the first alarm signal and the second alarm signal may be output based on the results of this determination.

The signal generating flow chart (S340B) of second type will now be described with reference to FIG. 6. First, information stored in the first sub-memory 230a (Novp_1) and the second sub-memory 230b (Novp_2) of second memory 230 is read (S341b). The read information may include information on the number of OVP operations stored in first sub-memory 230a (Novp_1) and information on the number of OVP operations stored in second sub-memory 230b (Novp_2).

Next, the number of OVP operation (Novp_1) stored in the first sub-memory 230a is compared with a preset first reference number of OVP operations (Novp_1_ref) (S343b). When the number of OVP operations (Novp_1) stored in first sub-memory 230a is greater than the preset first reference number of OVP operations (Novp_1_ref), the first alarm signal may be output (S345b). In addition, the number of OVP operations (Novp_2) stored in the second sub-memory 230b may be compared with a preset second reference number of OVP operations (Novp_2_ref) (S347b). When the number of OVP operations (Novp_2) stored in the second sub-memory 230b is greater than the second reference number of OVP operations (Novp_2_ref), the second alarm signal may be generated (S349b).

In the signal generating flowchart (S340B) of the second type, the first sub-memory 230a and the second sub-memory 230b of second memory 230 occupy different memories and have different addresses, and it is determined whether or not the respective numbers of operations (Novp_1) and (Novp_2) respectively stored in the first sub-memory 230a and the second sub-memory 230b are greater than respective reference numbers of OVP operations (Novp_1_ref) and (Novp_2_ref), and the first alarm signal or the second alarm signal may be output as a result of said determination.

The first alarm signal or the second alarm signal output in the signal generating step (S340) is input to the external system 20 to then display the information on the corresponding alarm signal or to notify the external system 20 of the information regarding the corresponding alarm signal. For example, the external system 20 may receive the information on the first alarm signal and may display the information regarding the first alarm signal through a display alert the user. Alternately, a sonic or vibration signal may instead be used to alert the user of an alarm.

According to the present invention, in a case where the OVP operation frequently occurs in a battery pack, it is determined whether the battery pack 10 or the external system 20 is likely to be the cause of the occurrences of the OVP operations. The present invention allows the results of this determination to be readily communicated to a user to provide guidance to the user as to whether it is the external device 20 or the battery pack 10 that is likely to be the cause of the OVP operations.

Although some embodiments of the present invention have been described, it will be understood by those skilled in the art that the present invention should not be limited to the described preferred embodiments. Rather, various changes and modifications can be made within the spirit and scope of the present invention, as defined by the following claims.

What is claimed is:

1. An over voltage protection (OVP) monitoring system, comprising:
   a battery pack connected to an external system, the battery pack including a battery;
   a first memory to store a voltage value of the battery;
   a second memory comprising a first sub-memory and a second sub-memory to store numbers of OVP operations of the battery;
   a controller to store the voltage value of the battery in the first memory upon an occurrence of an OVP operation and to increment a number of OVP operations stored in either the first sub-memory or the second sub-memory according to the voltage value of the battery stored in the first memory; and a signal generator to generate either a first alarm signal indicating a need to check the external system or a second alarm signal indicating a need to check the battery pack according to numbers of OVP operations stored in at least one of the first sub-memory and the second sub-memory of the second memory.

2. The OVP monitoring system of claim 1, further comprising a sensor to detect the occurrence of the OVP operation in the battery and to notify the controller of the occurrence of the OVP operation.

3. The OVP monitoring system of claim 1, the controller to store the voltage value of the battery at a most recent OVP operation upon an occurrence of a plurality of OVP operations.

4. The OVP monitoring system of claim 1, the controller to compare the voltage value of the battery stored in the first memory with a preset reference voltage value, wherein the number of OVP operations stored in the first sub-memory is incremented or the number of OVP operations stored in the second sub-memory is incremented based on a result of said comparison.

5. The OVP monitoring system of claim 1, the signal generator to compare a total number of OVP operations stored in the second memory with a preset total reference number of OVP operations, and when the total number of OVP operations stored in the second memory is greater than the preset total reference number of OVP operations, the signal controller to compare a number of OVP operations stored in the first sub-memory with a preset first reference number of OVP operations, and output either the first alarm signal or the second alarm signal based on whether the number of OVP operations stored in the first sub-memory is greater than the preset first reference number of OVP operations.

6. The OVP monitoring system of claim 5, wherein the first sub-memory and the second sub-memory are memories divided into an upper area and a lower area in a single storage area having a same address.

7. The OVP monitoring system of claim 1, the signal generator to compare the number of OVP operations stored in the first sub-memory with a preset first reference number of OVP operations, and generate the first alarm signal when the number of OVP operations stored in the first sub-memory is greater than the preset first reference number of OVP operations, and compare the number of OVP operations stored in the second sub-memory with a preset second reference number of OVP operations, and generate the second alarm signal when the number of OVP operations stored in the second sub-memory is greater than the preset second reference number of OVP operations.

8. The OVP monitoring system of claim 7, wherein the first sub-memory and the second sub-memory are different memories having different addresses.

9. The system of claim 1, the signal generator to output either the first alarm signal or the second alarm signal to the external system, the external system to display the received alarm information.

10. A method of monitoring over voltage protection (OVP) of a battery pack, comprising:

storing in a first memory a battery voltage value measured upon an occurrence of an OVP (Over Voltage Protection) operation in a battery of the battery pack;

incrementing either a number of OVP operations stored in a first sub-memory of a second memory or a number of OVP operations stored in a second sub-memory of a second memory according to the battery voltage value stored in the first memory; and generating either a first alarm signal indicating a need to check an external system connected to the battery pack or a second alarm signal indicating a need to check the battery pack according to a number of OVP operations stored in at least one of the first sub-memory and the second sub-memory of the second memory.

11. The OVP monitoring method of claim 10, further comprising detecting the occurrence of an OVP operation of the battery prior to the storing step.

12. The OVP monitoring method of claim 10, wherein the storing step comprises storing the battery voltage value measured for a most recent occurrence of an OVP operation upon an occurrence of a plurality of OVP operations.

13. The OVP monitoring method of claim 10, wherein the incrementing step comprises:

determining whether the battery voltage value stored in the first memory is greater than a preset reference voltage value; and incrementing either the number of OVP operations stored in the first sub-memory or the number of OVP operations stored in the second sub-memory based on said determination.

14. The OVP monitoring method of claim 10, wherein the signal generating step comprises:

determining whether a total number of OVP operations stored in the first sub-memory and the second sub-memory of the second memory is greater than a preset total reference number of OVP operations;

comparing the number of OVP operations stored in the first sub-memory of the second memory with a preset first reference number of OVP operations upon the total number of OVP operations stored in the first sub-memory and second sub-memory of the second memory being greater than the preset total reference number of OVP operations; and outputting one of a first alarm signal and a second alarm signal based on whether the number of OVP operations stored in the first sub-memory of the second memory is greater than the preset first reference number of OVP operations.

15. The OVP monitoring method of claim 14, wherein the first sub-memory and the second sub-memory of the second memory are storage areas divided into an upper area and a lower area in a single memory having a single address.

16. The OVP monitoring method of claim 10, wherein the signal generating step comprises:

comparing the number of OVP operations stored in the first sub-memory of the second memory with a preset first reference number of OVP operations;

generating the first alarm signal when the number of OVP operations stored in the first sub-memory is greater than the preset first reference number of OVP operations; and comparing the number of OVP operations stored in the second sub-memory of the second memory with a preset second reference number of OVP operations;

generating the second alarm signal when the number of OVP operations stored in the second sub-memory of the second memory is greater than the preset second reference number of OVP operations.

17. The OVP monitoring method of claim 16, wherein the first sub-memory and the second sub-memory of the second memory are different storage areas having different addresses.

* * * * *